(12) United States Patent
Ries

(10) Patent No.: US 7,068,133 B2
(45) Date of Patent: Jun. 27, 2006

(54) FLUX PUMP HAVING A HIGH-TEMPERATURE SUPERCONDUCTOR AND A SUPERCONDUCTING ELECTROMAGNET WHICH CAN BE OPERATED BY WAY OF THE FLUX PUMP

(75) Inventor: Günter Ries, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 936 days.

(21) Appl. No.: 10/033,745

(22) Filed: Dec. 27, 2001

(65) Prior Publication Data

US 2002/0171521 A1 Nov. 21, 2002

(30) Foreign Application Priority Data

Dec. 27, 2000 (DE) ................. 100 65 420

(51) Int. Cl.
*H01F 6/00* (2006.01)
(52) U.S. Cl. ............... 335/216; 336/DIG. 1; 361/141
(58) Field of Classification Search ............. 335/216; 336/DIG. 1; 361/141
See application file for complete search history.

(56) References Cited

U.S. PATENT DOCUMENTS

| | | | |
|---|---|---|---|
| 4,954,727 A * | 9/1990 | Hilal | 307/112 |
| 5,110,793 A * | 5/1992 | De | 320/108 |
| 5,523,914 A * | 6/1996 | Weck et al. | 361/141 |
| 5,680,085 A * | 10/1997 | Aihara et al. | 335/216 |

FOREIGN PATENT DOCUMENTS

JP 357083008 A * 5/1982
JP 401032604 A * 2/1989

OTHER PUBLICATIONS

"In-plane aligned $YBa_2Cu_3O_{7-x}$ thin films deposited on polycrystalline metallic substrates", Y. Iijima et al., *Applied Physics Letter*, pp. 769-771, Feb. 10, 1992.

"Study of Full-wave Superconducting Rectifier-type Flux-pumps", Qiuliang Wang et al., *IEEE Transactions on Magnetics*, vol. 32, No. 4, pp. 2699-2702, Jul. 4, 1996.

"On fully superconducting rectifiers and fluxpumps. A review. Part 2: Commutation modes, characteristics and switches", L.J.M. van de Klundert et al., *Cryogencis*, pp. 267-277, May, 1981.

"Fully superconducting rectifiers and fluxpumps Part 1: Realized methods for pumping flux", L.J.M van de Klundert et al., *Cryogencis*, pp. 195-206, Apr. 1981.

* cited by examiner

*Primary Examiner*—Michael Koczo, Jr.
(74) *Attorney, Agent, or Firm*—Harness, Dickey & Pierce, P.L.C.

(57) ABSTRACT

A flux pump of the rectifier type having high-temperature superconductors with switches, which can be controlled by way of a heater, in particular with trigger pulses D' and self-stabilization in time with the rectifier is disclosed. An arrangement of the flux pump and a superconductor electromagnet, which may be supplied using the flux pump, may be integrated in a common cryostat housing.

27 Claims, 5 Drawing Sheets

FLUX PUMP HAVING A HIGH-TEMPERATURE SUPERCONDUCTOR AND A SUPERCONDUCTING ELECTROMAGNET WHICH CAN BE OPERATED BY WAY OF THE FLUX PUMP

The present application hereby claims priority under 35 U.S.C. §119 on German patent publication number DE 10065420.7 filed Dec. 27, 2000, the entire contents of which are hereby incorporated by reference.

FIELD OF THE INVENTION

The present invention generally relates to a flux pump of the rectifier type with $HT_c$ (high-temperature) superconducting switches, and to an $HT_c$-superconducting electromagnet which can be operated using the flux pump.

BACKGROUND OF THE INVENTION

Strong magnetic fields with the magnetic field strength having a high degree of stability over time are required, for example, for nuclear magnetic resonance imaging. Electromagnets with superconducting coils have been developed for this purpose. Coils such as these have been known for several decades, composed of low-temperature ($LT_c$) superconductor material such as niobium-tin or niobium-titanium. Magnets such as these can be operated in the temperature range around about 4 K.

For about the last decade, superconducting materials of the high-temperature type ($HT_c$ superconductors) have also been known, which are superconducting up to liquid air temperatures. For example, these superconducting materials remain superconducting at temperatures below 77 K. Electromagnets with $HT_c$-superconducting coils have also already been produced, which may be used for strong magnetic fields, for example up to temperatures below about 40 K. This relatively low operating temperature is due to the fact that the $HT_c$ current capacity of the $HT_c$ superconductor materials used for this purpose, for example bismuth cuprate (Bi, Pb) $_2Sr_2Ca_2Cu_3O_{10}$ and $Bi_2Sr_2CaCu_2O_8$ and rare-earth cuprates RE $Ba_2Cu_3O_7$ where RE=Nd, Gd, Sm, Er, Y, is sufficient only up to an operating temperature which is limited as a function of the magnitude of the magnetic field that exists.

In an ideal situation, a short-circuit superconducting current produced and flowing in such a superconducting coil of a magnet lasts indefinitely. A device known as a flux pump is used, for example, for feeding such a superconducting current into a superconductor coil. One such flux pump is known, for example, from "Study of Full-Wave Superconducting Rectifier-Type Flux-Pumps" in IEEE Transactions on Magnetics, Vol. 32 (1996) pp. 2699–2702 and from "On Fully Superconducting Rectifiers and Flux Pumps", Cryogenics, May 1991, pages 262–275.

The indicated articles relate exclusively to superconductors of the low-temperature ($LT_c$) type, that is to say to materials such as niobium-tin and niobium-titanium which have been mentioned. FIG. 1 shows an example of a flux pump 2 of the rectifier type from the prior art (from IEEE Transactions . . . as above), in which 11 denotes the superconducting coil with an $LT_c$ superconductor of an electromagnet 111, such as that which is known to be used, for example, for the already mentioned nuclear magnetic resonance imaging. Reference numeral 12 denotes a power source, which supplies the electrical power resulting in the formation of the superconducting current that flows in the coil 11 during operation of the electromagnet. Reference numeral 13 denotes a transformer with a primary coil 113 and, in this example, reference numeral 2 denotes secondary coils 213 and 313 connected in series. Reference numerals 15 and 16 denote two switches for making and breaking the circuit for the superconducting current flowing in the circuit of the respective secondary coil 213 or 313.

In the prior art, these two secondary coils and switches are composed of $LT_c$-superconducting material while, in the invention which is still to be described, they are composed of $HT_c$-superconducting material. In order to be able to operate as a transformer 13, the power source generally annotated with reference numeral 12 supplies an alternating current, that is to say a current with a current direction which is repeatedly and successively reversed. The switches 15 and 16 are opened and closed in time with this current direction change, to be precise in the opposite sense to one another. This results in rectification of the electric current flowing through the lines that are annotated with reference numerals 20 and 21. This current is the supply current for the coil 11 of the electromagnet. Reference numeral 23 denotes a known protection device, which will not be described in detail, for protection of the flux pump 2. Reference numeral 25 denotes a control system for controlling the timing of the changes in the supply current from the power source 12 and the switches 15 and 16.

In the known flux pump shown in FIG. 1, the switches 15 and 16 are low-temperature ($LT_c$) superconductor switches. Their "open" and "closed" states are produced by the "superconducting" or "normally conductive" states of the conductor material contained in them. The superconducting state occurs when cooled to a sufficiently low temperature. Heating the respective switch element changes it to the normally conductive state, which corresponds to an open switch. This conversion is reversible.

The coil 11 of the electromagnet and its circuit can be successively charged with superconducting current in a manner known as periodic switching of the switches 15 and 16, so that a corresponding constant electromagnet field with a strong magnetic field strength and a high magnetic flux is correspondingly produced successively in the coil 11 of the electromagnet, and its permanently provided superconduction is maintained. This permanence for the $LT_c$ superconduction and the materials used for this purpose and which have already been mentioned above is true to a large extent. For example, once a superconductor electromagnet has been charged, for example in a nuclear magnetic resonance imager, its magnetic field strength remains constant over a sufficiently long time that the extremely stringent requirements for constancy of the field for nuclear magnetic resonance imaging are satisfied by this magnetic field. Recharging is required, for example, only after about 100 hours, provided no technical defects or operating errors occur.

The fundamental principles of these known flux pumps are applicable only, to a limited extent, to the use of high-temperature $HT_c$ superconducting materials provided according to the present invention. For projects and apparatuses according to the present invention, which use such materials, it is often necessary to take into account particular or different conditions or circumstances.

SUMMARY OF THE INVENTION

An object of the present invention is to specify, for a flux pump according to the invention and for the combination according to the invention of such a flux pump and a superconductor electromagnet for a highly constant magnetic field, the measures by way of which corresponding apparatuses may be produced advantageously using $HT_c$ superconductor material.

BRIEF DESCRIPTION OF THE DRAWINGS

The figures mentioned below, and which are also included in the disclosure content of the invention, will also be used in particular for additional explanation in conjunction with the following description of the present invention.

DETAILED DESCRIPTION OF THE PREFERRED EMBODIMENTS

Figure 1:
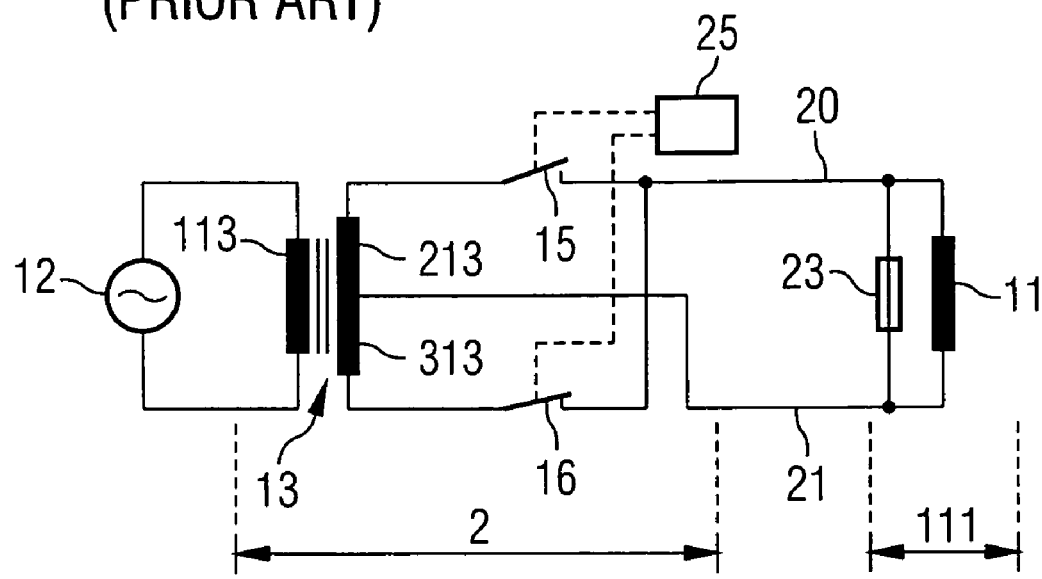
FIG. 1 shows an outline diagram of a known circuit design, as is also considered for the present invention.
Figure 2:
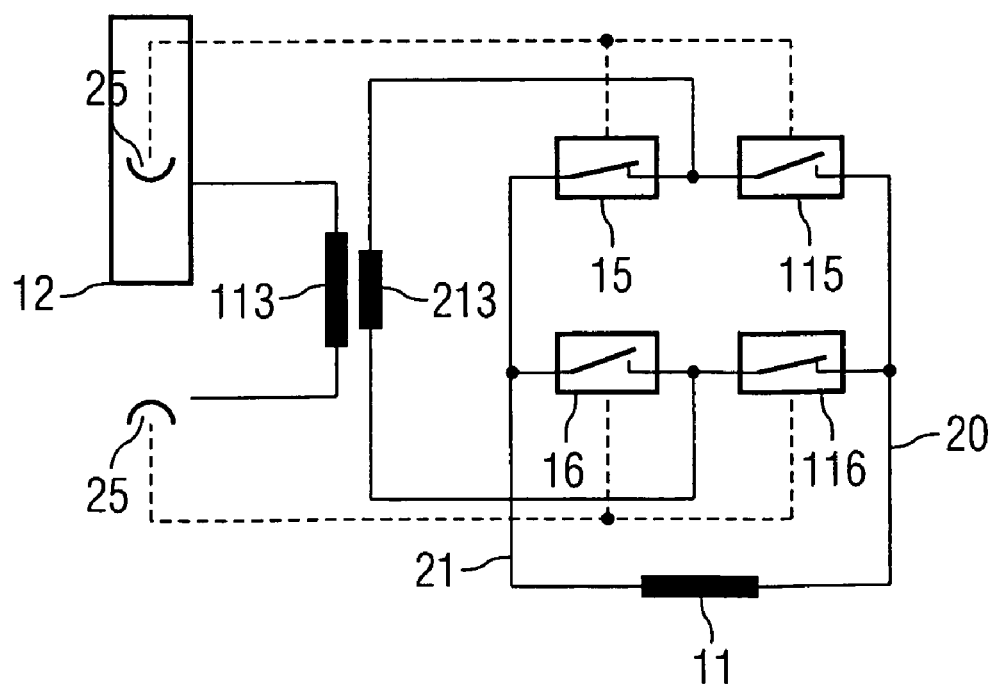
FIG. 2 shows a variant relating to the rectifier circuit in FIG. 1.

FIG. 1 shows a circuit, which is also referred to as a full-wave rectification circuit with two secondary coils, for the flux pump 2. A bridge circuit, which likewise has a rectifying effect, can also be used instead of this for the invention, as is known in general form from electrical engineering where diodes are used, and this is shown here as an intended embodiment of the invention, in FIG. 2. Details of this bridge circuit in FIG. 2 which at least substantially match those in FIG. 1 have the same, already defined designations. Reference numerals 115 and 116 denote the two additional switches in the bridge circuit, which has a total of four switches. In this circuit, the transformer 13 requires only one secondary coil 213.

One advantageous measure according to the invention is to arrange at least the superconducting coil 11 of the electromagnet and its associated flux pump in the vacuum area of one and the same cryostat 100. This measure has the advantage that only one refrigeration supply device and only one cryostat vessel are thus required.

For the present invention, which achieves the object mentioned above, according to patent claim 1 and its development according to the dependent claims, one particular condition which, for example, needs to be taken into account, is that the apparatus according to the invention with a superconducting flux pump and a superconducting electromagnet is, according to the invention, equipped with $HT_c$ superconductor material for advantageously higher operating temperatures, and may be designed such that the flux pump makes it possible to recharge the electromagnet at intervals of a few seconds in each case. This is because the required constancy of the magnetic field strength of the magnet for an apparatus according to the invention using $HT_c$-superconductor material can be maintained within the predetermined tolerance limits only by recharging processes which follow one another at such short intervals. This is essentially based on replacing known used $LT_c$-superconductor material by $HT_c$ superconductor material used according to the invention. It is also necessary to remember that, in the case of an apparatus according to the invention using $HT_c$-superconductor material, the flux pump and the magnet can be operated at an advantageously higher temperature, but both at different temperatures, for example with the flux pump being slightly below 77 K and the electromagnet in the range of about 20–40 K.

The teaching according to the invention provides for the one or more secondary windings of the transformer to be $HT_c$-superconducting conductors, based on Bi2212-, Bi2223-rhythm conductors in the form of a silver matrix, and/or YBa—CuO-conductors on a metallic carrier ribbon as the preferred examples. Other $HT_c$-superconductor materials, including those in the form of wire, can also be used. $HT_c$-superconductor material may likewise be used for the primary winding of the transformer, but copper wire is also suitable for this coil provided it has a very high specific conductivity at low temperatures, for example around 77 K, although this has the disadvantageous consequence of $I^2R$ heat losses. A ratio of very much more than unity, preferably more than about 100 to 1 000, should be selected for the turns ratio of the primary coil to the respective secondary coil. The transformer core which should be used by preference is composed in particular of laminated iron, some other soft-magnetic material, or is a ferrite. A transformer which has only air-cored coils can also be used.

Figure 3:
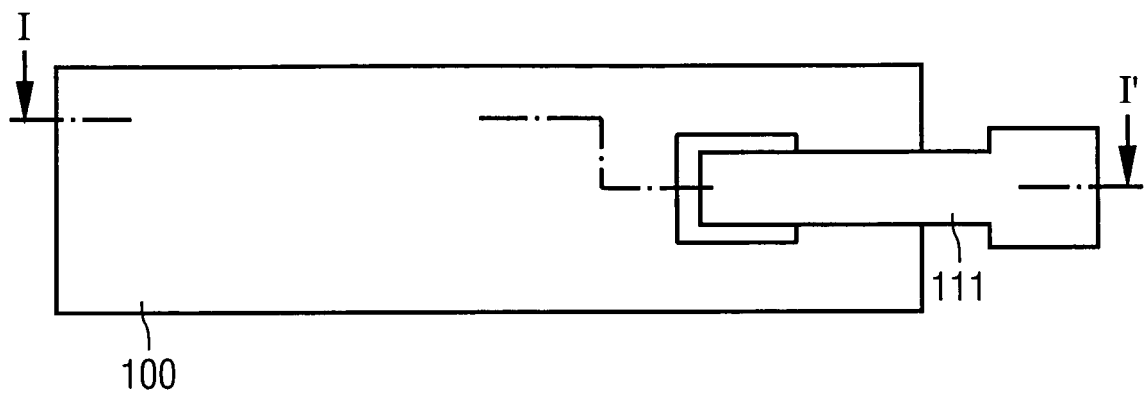
FIG. 3 shows, in the form of a view, the basic design of a combination according to the invention of a flux pump and an electromagnet in a common cryostat.
Figure 4:
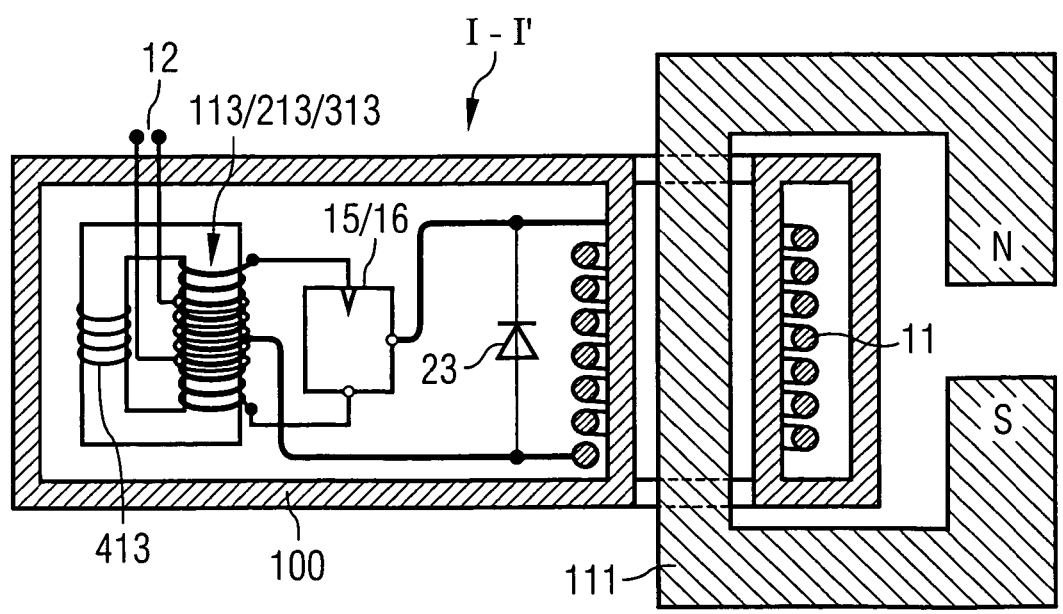
FIG. 4 shows as a section I—I' the basic design of FIG. 3.

FIG. 3 shows an arrangement according to the invention in a common cryostat 100, including the superconducting coil 11 of the electromagnet 111 and the flux pump 2 with the switch arrangement 15, 16, and the transformer 13 with the primary coil 113 and the secondary coils 213 and 313. The primary coil and the secondary coils are illustrated wound one inside the other. The reference numeral 12 indicates the supply power source. Reference numeral 413 denotes a probe coil, by way of which the magnetic flux in the core, provided here, of the transformer 13 can be monitored.

Figure 5:
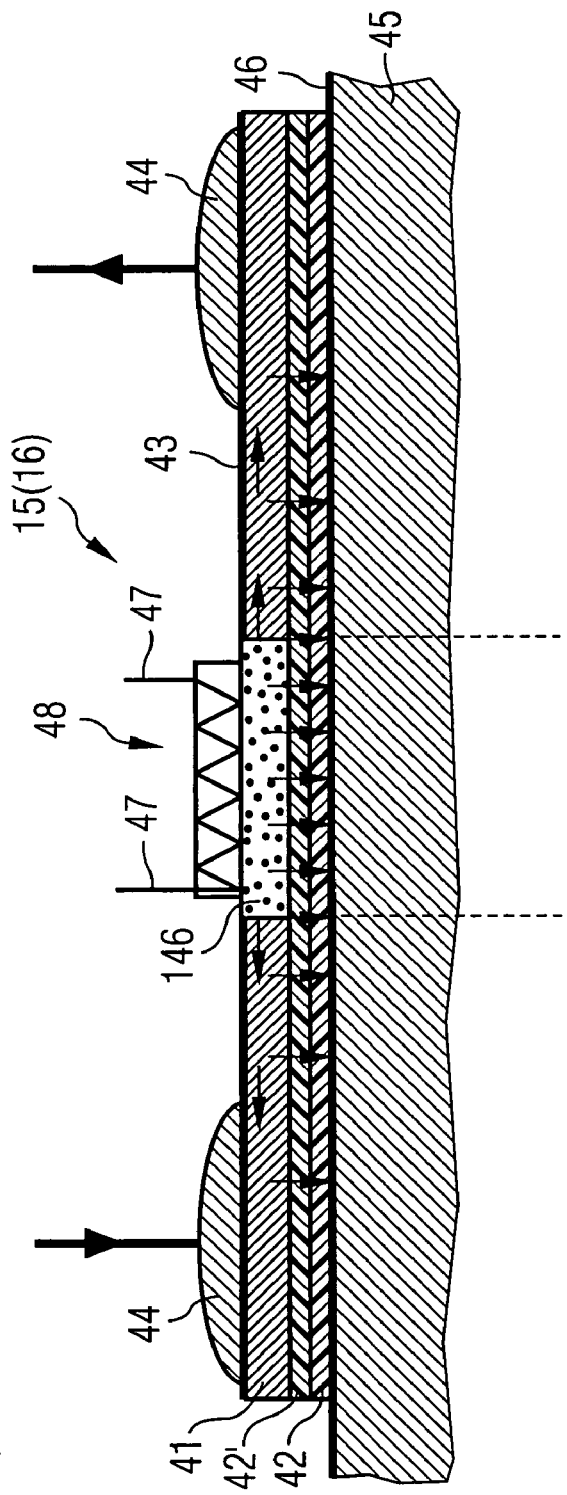
FIG. 5 shows an embodiment for a switch, according to the present invention, for the rectifier circuit for a flux pump according to the invention.

FIG. 5 shows an exemplary embodiment of a switch used for the invention. $HT_c$-superconductor material is provided for a switch 15, 16, 115, 116, to be preferably in the form of a 0.2 to 2 μm thick thin film 41 with a high current carrying capacity of at least $10^6$, and preferably more than $10^7$ A/cm$^2$. Preferred suitable $HT_c$ materials include REBaCuO where RE=one of the rare earth metals Nd, La, Dd, Eu, Sm etc., or yttrium. Bi2212-, Bi2223- or LaSr—CuO are likewise also suitable. The thin film 41 is preferably applied, in the case of a polycrystalline substrate, to an electrically insulating buffer layer 42' with crystalline alignment. This buffer layer 42' can be deposited for example, using the known IBAD method (Jijima, Appl. Phys. Lett. 60 (1990) page 769). This buffer layer is used in particular for biaxial crystalline alignment or texturing of the abovementioned thin film 41 that is to be deposited on it. The thin film 41, or the buffer layer 42' on which the thin film 41 is deposited, is applied to a thin, for example 0.1 to 0.05 mm, poorly thermally conductive, electrically non-conductive substrate 42. Polycrystalline ZrO, MgO, or glass etc. are suitable for this purpose. In the case of a monocrystalline substrate, for example $SrTiO_3$, MgO, the buffer layer may also be omitted. In addition, an electrically normally conductive protection and/or shunt layer 43 composed of gold, silver, copper etc. may also be applied to the superconductor thin film 41 of the type described above. Reference numeral 44 denotes connections which are applied at a lateral distance from one another, for example, the thin film 41 of the $HT_c$-superconductor material, such that contact is made with a low impedance. Such a contact may be made, for example, by way of solder connection. These are used as the input and output for the electric current to be switched by the switch, that is to say flowing through the thin film in the lateral direction between these connections 44.

One such structure as described above is provided for each switch 15, 16, 115, 116, essentially in the form of strips in the lateral direction. One such strip-type structure 41 to 44, corresponding to a switch in each case, is located on a base plate 45 that is preferably common to all the switches 15, 16, 115, 116 involved. This base plate 45 is composed of a highly thermally conductive material such as copper. However, a layer or a coating 46 may also provided on the base plate, between this layer structure 41 to 43 and its contact surface with the base plate 45. This layer or this coating is composed of a material which is selected for its thermal conduction capacity and its thickness is designed specifically. This material may be, for example, preferably fiber-reinforced synthetic (GFC) or the like, but is desirably material that is resistant to low temperatures. The structure 41 to 43 may be applied to the base plate 45, or to the coating 46, by way of adhesive or by means of a grease. In all cases, it is important that a thermal resistance, which is designed specifically in a selected defined manner, is provided between the base plate 45 and the structure 41 to 43 located above it, in order to ensure that the respective switch operates.

During operation at low temperature, the base plate 45 is kept below the critical temperature $T_c$ of the $HT_c$-superconductor material provided for the thin film 41. This means that this $HT_c$ thin film 41 is kept in the superconducting state without any further action. In this state, superconducting current flows between the connections 44 through the thin film 41, that is to say that the relevant switch 15 or 16, 115, 116 is only "closed".

A heater 48, for example in the form of a film composed of a material that is suitable for a heater, is applied to the thin film 41 or to the shunt layer 43 which may be located above it, physically at the point in the thin film 41 of the switch where the switching process, that is to say the interruption of the current which would otherwise flow is intended to take place. This heater 46 is supplied via its connecting lines 47 with current pulses which produce $I^2R$ heat in order to change the superconductor material, located underneath, of the switch from the superconduction state to the resistive state, namely at least close to or above the critical temperature, $T_c$ for that time period within which the switch is intended to be opened.

Figure 6:
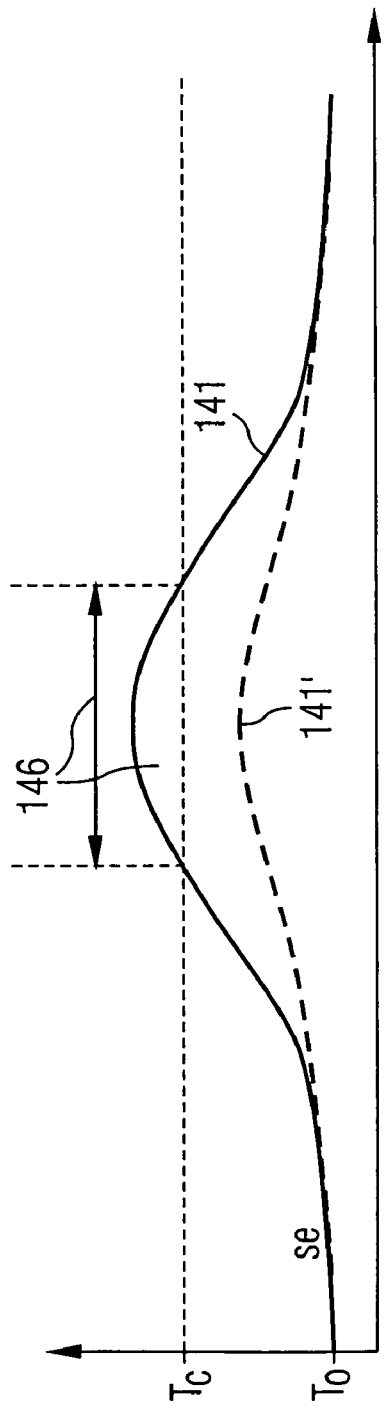
FIG. 6 shows as a diagram a temperature profile along the switch according to FIG. 5.

FIG. 6 shows a diagram, in which the X axis is the lateral direction in the thin film 41, and the temperature is plotted on the ordinate. $T_c$ is the critical temperature of the $HT_c$-superconductor material of the thin film 41. The base plate 45 is operated approximately at the temperature level $T_0$. This is, for example, the operating temperature of the magnet coil of the cryostat. The curve 141 shown in FIG. 6 indicates, at least approximately, the temperature profile within the $HT_c$-superconductor material of the thin film 41, to be precise in the lateral direction between the two connections 44 and in the state or phase when the switch is open. As can be seen, in this state, the temperature in the thin film 41 is increased in the area below the heater 48 to values above the critical temperature $T_c$, for example, by supplying heat, counteracting the cooling down through the base plate 45. Once the electric current which flows through the heater 46 and heats the switch gap 146 has been switched on again, the switch gap 146 can in each case once again cooled down to temperatures below the critical temperature $T_c$. It should be remembered in this case that a normally conductive resistive current flowing through the switch produces $I^2R$ heat in the switch gap 146 during the normally conductive phase of the superconducting material of the thin film located there. This counteracts the cooling-down effect, and must be quantitatively taken into account in an appropriate manner.

A further operating mode for the switches for the present invention is described in the following text.

Instead of keeping the heater 46 in operation continuously during the phase when the switch is open, as described above, an alternative method for operation can be used, as a development of the invention. In this case, only a comparatively brief current pulse is applied to the heater 46 in each case, in the form of a trigger process, for the duration of the switch phase. The $I^2R$ heat produced by such a current pulse in the heater is designed such that it heats the switch gap to temperatures above the critical temperature $T_c$ for an appropriately short time. This now results, initially briefly, in the material being forced to an extreme extent from the outside to become normally conductive with a resistance R, associated with the production of resistive heat $V^2/R$ (V=the electrical voltage applied to the area 146 and induced in the secondary coils of the rectifier circuit), namely as a result of the resistive residual current which still flows in this case and is also dependent on this voltage between the connections 44. An equilibrium between the heat dissipation into the base plate and the $I^2R$ heat produced by the residual current in the switch, which is then in the open or interrupted state in this case, can then be achieved by dimensioning of the heat dissipation between the thin film 41 and the base plate 45 in the region of the switch. This results in a self-stabilizing state for the blocking of the electric current which would otherwise flow between the connections 44 and through the coil 11 when the switch is closed.

This advantageously self-stabilizing state of the "open switch" function is ended by considerably reducing the current intensity of said residual current. This state occurs whenever current is supplied to the primary side of the transformer 13 such that the rate of change of the magnetic flux $d\phi/dt$ in the transformer core tends to zero for a time interval $\tau$ that is to say in the time interval when the current amplitude of the primary current in the transformer is constant. In this time interval, the secondary voltage, induced in the transformer and in the rectifier circuit, across the open switch also tends to the value zero. As a consequence, the residual current and the $I^2R$ heat produced by it in the switch gap are so low that the heat dissipation now becomes the predominant factor, with the switch gap being cooled down below the critical temperature and ending the self-stabilization. The switch gap then changes to the superconducting state and the relevant switch is closed again, specifically until the next triggering heating pulse is produced. Thus, in this embodiment of the invention, in addition to the synchronization (which is required for such flux pumps) the current supply of the primary side to the clock cycle for operation of the switches in the rectifier circuit, it is also necessary to match the form of the primary alternating current, or the alternating current pulse excitation, to this specific operation of the switches. With regard to this adaptation process, reference should also be made to the following statements relating to FIGS. 7 to 13.

This achieves the aim of ensuring that the energy stored in and the heat dissipation from the switch gap 146, which has electrical resistance at temperatures above the critical temperature, is kept as low as possible, or is designed to be low, in order to minimize the cooling down time from the resistive state to the (once again) superconducting state. The flux pump is thus operated at a high cycle frequency during the cycle, to be precise without needing to introduce a large amount of such thermal energy into the cold operating area of the cryostat when carrying out the repeated switching processes.

The flux pump 2 is used to charge the electromagnet 111 by supplying current from the power source 12. Reference should be made to FIGS. 7 to 13, in this context. These figures show the processes described in the following text. The processes in the left-hand half of FIGS. 7 to 13 relate to complete charging of the electromagnet. Those in the right-hand half of the figures relate to the recharging processes in order to compensate for losses that occur over time, that is to say the processes for stabilizing the magnetic field of the electromagnet 111 over a period of time.

Figure 7:
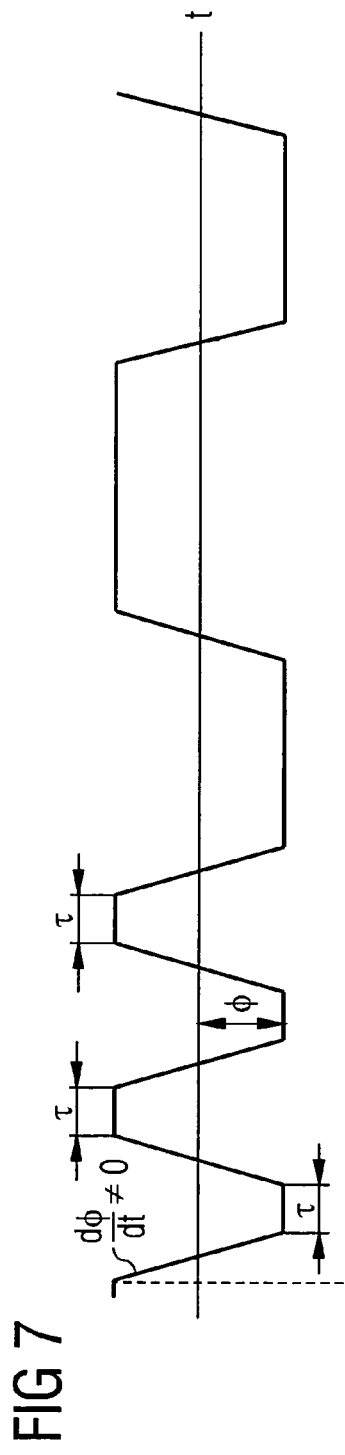
FIG. 7 shows a time profile of the magnetic flux in the core of a transformer of the flux pump according to the invention.
Figure 8:
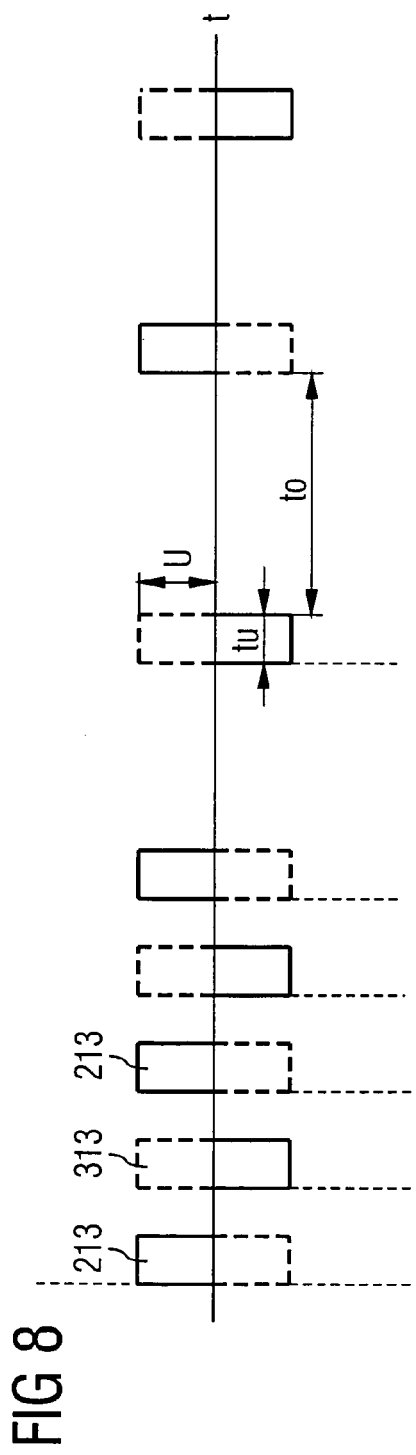
FIG. 8 shows voltage pulses according to the time profile of FIG. 7.
Figure 9:
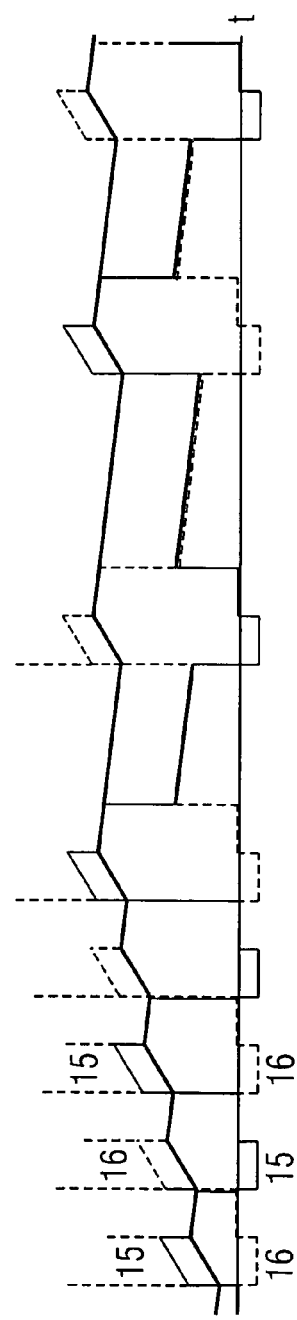
FIG. 9 shows the current profile of an electromagnet according to the voltage pulses of FIG. 8.

FIG. 7 shows an example of a time profile for a flux pump according to the invention, showing the magnetic flux $\phi$ produced in the core of the transformer 13 while it is being supplied. The time t is plotted on the abscissa. Any rate of change in the magnetic flux $\phi$ produces a respective voltage pulse on the secondary side, across the respective secondary coil 213, 313, as shown by FIG. 8. A current then flows in the circuit of the secondary coil, for example 213, when the switch, for example the switch 15 is switched on. This leads to an increase in the current in the magnet coil 11 as shown by the stepped curve of FIG. 9. The subsequent flux rate of change in FIG. 7 in turn leads to a voltage pulse on the secondary of the transformer, to be precise to a pulse with the opposite mathematical sign, as shown in FIG. 8. As a result of the operation of the rectifier circuit, with the switch 16 now closed, a current now flows through the secondary coil 313 and, as shown in FIG. 9, this leads to a further increase in the flux produced by the current in the magnet coil 11. As is known for flux pumps, this process is continued until the magnet coil 11 is finally charged to the current intensity at which this magnet coil 11 reaches its predetermined, strong magnetic field.

Figure 10:
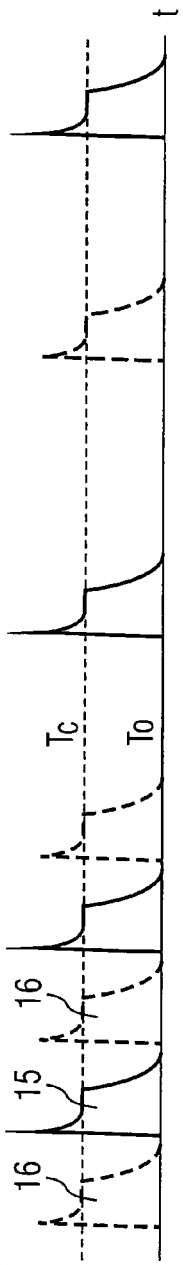
FIG. 10 shows the time related temperature profile of a superconducting switch.

In the time profile of the processes described above, the switch 15 in one arm and the switch 16 in the other arm of the rectifier switches are alternately closed to allow current to flow, that is to say they are in the superconducting state. The switch 16, for example, which is switched off at the time when current is flowing through the switch 15, is, as shown in FIG. 10, heated up to or above the critical temperature $T_c$ of the material of the thin film 41, and is thus switched off, except for said residual current.

For the embodiment of the invention which does not make use of the self-stabilizing effect, the heater 46 is supplied, as stated above, with heating current for the entire time duration of the respective pulse in FIG. 8 on the one hand in the one switch 15, and on the other hand in the other switch 16—in order to produce a temperature in the thin film 41 greater than the critical temperature $T_c$ in its respective switch gap 146, and to maintain this temperature for the time during which the switch is open.

Figure 11:
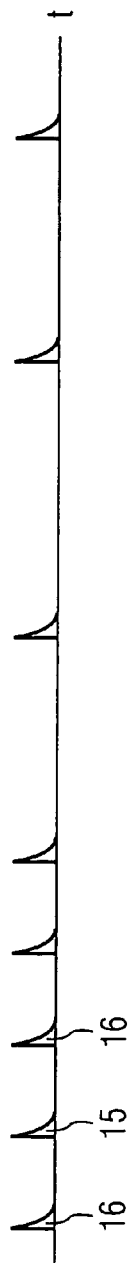
FIG. 11 shows the time related temperature profile of a superconducting switch with self-stabilizing switch effect.

For the embodiment variant of the invention with the self-stabilizing switch effect, FIG. 11 shows the sequence of the current pulses mentioned above for the trigger-like operation for in each case opening the switch 15 or 16. The individual current pulses in FIG. 11 each initially lead to a rise to at least the critical temperature $T_c$. This leads to the occurrence, mentioned above, of the resistive residual current but with its $I^2R$ heat providing self-stabilization for this state, in the situation where the respective switch is still switched off. FIGS. 7 to 10, in particular, show the significance of the time interval $\tau$, which is provided between two successive time changes in the magnetic flux as shown in FIG. 7, when the magnetic flux $\phi$ is at least approximately constant. During this time interval, virtually no electrical voltage is applied to either of the secondary coils of the transformer, and there is thus no inductively excited flux produced by any current flow in them—even when the respective switch 15, 16 is closed. This leads to the above-described drop or breakdown over time of the residual current flowing through the open switch, as described above, and hence to the self-stabilizing effect, by means of which the respective switch 15, 16 can change back to the state where the thin film 41 is superconducting, that is to say its temperature can decrease to the temperature $T_0$, as shown by FIG. 10.

The invention results in minimal heat emission during switching, without needing to unacceptably reduce the pulse repetition frequency for recharging.

Figure 12:
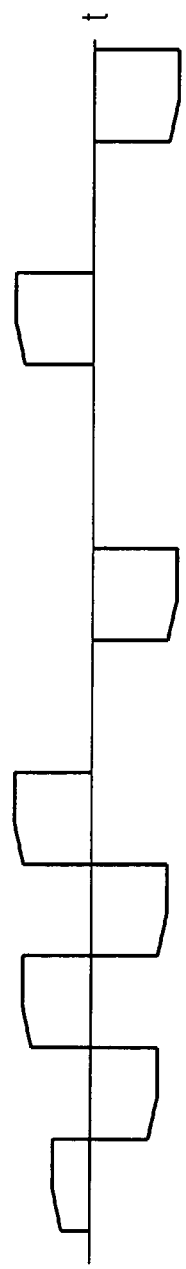
FIG. 12 shows the time related primary current of a transformer.
Figure 13:
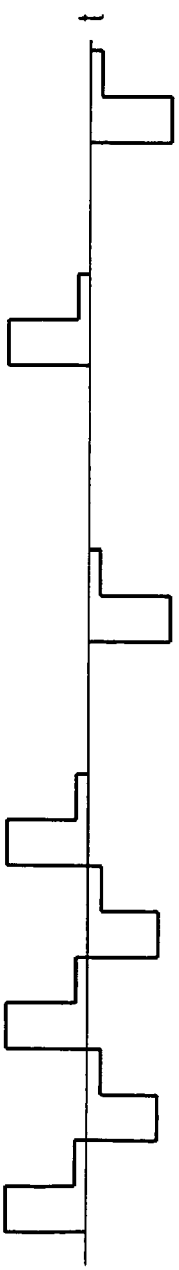
FIG. 13 shows the time related voltage of the transformer with the primary current according to FIG. 12.

FIG. 12 shows the primary current in, and FIG. 13 the primary voltage across, the transformer 13, or the primary coil 113 of the transformer 13.

The right-hand side of FIGS. 7 to 13, which relates to the stabilization of the magnetic field strength of the electromagnet 111 over time, differs from the charging process in the left-hand half of FIGS. 7 to 13 in that the change in the mathematical sign of the primary current or of the magnetic flux in the transformer 13 takes place over an extended time, namely as is required for recharging, and as can be seen from FIG. 9 in the right-hand half.

The charging or recharging of the electromagnet 111 in order to keep its magnetic field constant over time is in this case carried out, as shown in FIGS. 7 to 13, by adjusting the pulse repetition frequency and/or the pulse amplitude, and by appropriate control of the switches in the rectifier circuit of the flux pump. The pulse repetition frequency may preferably be predetermined by way of or by using a control loop.

The control loop includes, for example, measures for cyclic NMR field measurement in or on the magnet. This is done by, for example, detecting the difference between the actual and nominal value of the NMR frequency. The difference that occurs is once again compensated for by a correspondingly proportional change in the pulse repetition frequency used to drive the input of the flux pump, that is to say the primary coil 113 of the transformer 13.

As an alternative measure to achieve field stabilization, it is also possible to determine this error in the area in which the temperature is at the required low level by means of a current measurement or by using a Hall sensor, once again converting this to a corrected pulse repetition frequency.

In a corresponding way to the processes illustrated in FIGS. 7 to 13, once an electromagnet 111 has been charged, it may be discharged again in a reversible manner by way of the flux pump, that is to say with this flux pump operating in the opposite direction. In this case, using the same pulse pattern, the switch which was closed during charging is now opened, and vice versa, in each case.

The invention provides for the flux pump 2 and the magnet 111 advantageously to be arranged together in a common cryostat. The temperature in this cryostat can be set to the temperature level envisaged for the electromagnet 111, for example to the value $T_0$ mentioned above, namely being designed such that the $HT_c$-superconductor material of the coil 11 of the magnet has the required current carrying capacity in the magnetic field that is produced. It is then possible to provide for the base plate 45 of the switch arrangement also to be kept at a higher temperature, but below the temperature $T_c$ of the superconductor material. The required heating power for the heater 48 for the switch (FIG. 5) and the dimensioning of the heat transfer capability from the thin film 41 to the base plate 45 are dependent on this.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

The invention claimed is:

1. An apparatus having a superconductor flux pump including a transformer having, on a secondary side thereof, at least one superconducting transformer coil, and at least one controllable switch, the pump being intended for feeding current into a superconducting coil of an electromagnet, wherein the at least one superconducting transformer coil on the secondary side of the transformer includes an $HT_c$ superconductor material, the at least one controllable switch has a switch gap being in the form of a strip, the at least one switch at least in part includes an $HT_c$ superconductor material in the form of a thin film which is applied to a buffer layer for texturing of the thin film, and wherein a controllable heater is arranged adjacent to and in thermally conductive contact with the switch gap.

2. The apparatus as claimed in claim 1, wherein the flux pump and the superconducting coil of the electromagnet are arranged together in a common cryostat.

3. The apparatus as claimed in claim 1, wherein the thin film has a thickness of 0.2 to 2 µm in the region of the switch gap.

4. The apparatus as claimed in claim 1, wherein a current carrying capacity of a cross section of the thin film is at least $10^6$ A/cm² in the region of the switch gap.

5. The apparatus as claimed in claim 1, wherein the $HT_c$ superconductor material chosen for the at least one controllable switch is a material from the RE BaCuO group, with the RE being at least one of the rare-earth metals Nd, La, Dd, Eu, Sm and yttrium.

6. The apparatus as claimed in claim 1, wherein one of Bi2212, Bi2223, and LaSr—CuO is chosen as a material for the at least one controllable switch.

7. The apparatus as claimed in claim 1, wherein one of polycrystalline ZrO, MgO and glass is provided as a substrate for the thin film.

8. The apparatus as claimed in claim 7, wherein the thickness of the substrate of the thin film is 0.05 to 0.1 mm.

9. The apparatus as claimed in claim 1, wherein the at least one controllable switch is formed on a base plate composed of highly thermally conductive material.

10. The apparatus as claimed in claim 9, wherein a base plate is at least partially copper.

11. The apparatus as claimed in claim 9, wherein a surface of the base plate is provided, at least in the region of the switch gap, with a coating with a thickness and composed of a material such that the coating has a thermal conduction capacity that can be predetermined between the base plate and the thin film.

12. The apparatus as claimed in claim 11, wherein a plastic material is used for the coating.

13. The apparatus as claimed in claim 11, wherein a grease is provided as the coating.

14. The apparatus as claimed in claim 2, wherein the switch gap is in the form of a thin film.

15. The apparatus as claimed in claim 3, wherein a current carrying capacity of a cross section of the thin film is at least $10^6$ A/cm² in the region of the switch gap.

16. A method of operating a flux pump for feeding current into a superconducting coil of an electromagnet, including a transformer having, on a secondary side thereof, at least one superconducting transformer coil including $HT_c$ superconductor material, at least one controllable switch including $HT_c$ superconductor material and having a switch gap, and a controllable heater arranged adjacent to and in thermally conducive contact with the switch gap, comprising the step of:

feeding current pulses to the transformer of the flux pump and driving the controllable heater with a heating pulse during a duration where the controllable switch is in an open state.

17. The method according to claim 16, further comprising the step of:

driving the controllable heater, at a time the at least one controllable switch is in an open state, with a heating pulse having a time duration shorter than a switch phase of the at least one controllable switch, for a controlled reduction of residual current.

18. The method according to claim 17, wherein the controlled reduction of residual current is at least partially brought about by way of respective time intervals in the current pulses fed to the transformer.

19. The method according to clam 18, wherein during the respective time intervals, a magnetic flux in the transformer is kept substantially constant.

20. The method according to claim 16, further comprising the step of:

achieving current stabilization in the electromagnet by controlling the current pulses fed to the transformer.

21. The method according to claim 20, wherein the current stabilization is achieved by controlling the frequency of the current pulses.

22. The method according to claim 20, wherein the current stabilization is achieved by controlling the amplitude of the current pulses.

23. A flux pump and electromagnet arrangement, comprising:

a transformer having a transformer coil and at least one secondary transformer coil; and at least one switch being operationally associated with the at least one secondary transformer coil, wherein the at least one secondary transformer coil and the at least one switch are at least partially made of $HT_c$ superconductor material.

24. The arrangement according to claim 23, wherein the transformer includes two secondary transformer coils being at least partially made of $HT_c$ superconductor material.

25. The arrangement according to claim 23, wherein the $HT_c$ superconductor material of the at least one switch is 0.2 to 2 µm thick thin film having a high current carrying capacity.

26. The arrangement according to claim 25, wherein the high current carrying capacity is at least $10^6$ A/cm².

27. The arrangement according to claim 23, wherein the transformer has a plurality of secondary transformer coils, each of the plurality of secondary transformer coils being made of $HT_c$ superconductor material.

* * * * *